(12) United States Patent
Balakrishnan et al.

(10) Patent No.: US 10,381,349 B2
(45) Date of Patent: Aug. 13, 2019

(54) STACKED COMPLEMENTARY JUNCTION FETS FOR ANALOG ELECTRONIC CIRCUITS

(71) Applicant: International Business Machines Corporation, Armonk, NY (US)

(72) Inventors: Karthik Balakrishnan, White Plains, NY (US); Bahman Hekmatshoartabari, White Plains, NY (US); Alexander Reznicek, Troy, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 15/689,473

(22) Filed: Aug. 29, 2017

(65) Prior Publication Data

US 2019/0067280 A1    Feb. 28, 2019

(51) Int. Cl.
| H01L 27/098 | (2006.01) |
| H01L 21/8232 | (2006.01) |
| H01L 29/66 | (2006.01) |
| H01L 29/808 | (2006.01) |
| H01L 29/423 | (2006.01) |

(52) U.S. Cl.
CPC ........ *H01L 27/098* (2013.01); *H01L 21/8232* (2013.01); *H01L 29/42316* (2013.01); *H01L 29/66909* (2013.01); *H01L 29/8083* (2013.01)

(58) Field of Classification Search
CPC ..................................................... H01L 27/098
See application file for complete search history.

(56) References Cited

U.S. PATENT DOCUMENTS

| 5,479,033 A | 12/1995 | Baca et al. |
| 6,307,223 B1 | 10/2001 | Yu |
| 7,355,224 B2 | 4/2008 | Cai |
| 7,560,755 B2 | 7/2009 | Kapoor |
| 7,629,631 B2 | 12/2009 | Yilmaz |
| 8,481,372 B2 | 7/2013 | Mouli |
| 9,076,662 B2 | 7/2015 | El-Kareh et al. |

OTHER PUBLICATIONS

K-J. Gan et al., "Design and characterization of the negative differential resistance circuits using the CMOS and BiCMOS process," Analog Integrated Circuits and Signal Processing, vol. 62, No. 1, 2010, pp. 63-68.

(Continued)

*Primary Examiner* — Marvin Payen
(74) *Attorney, Agent, or Firm* — L. Jeffrey Kelly; Ryan, Mason & Lewis, LLP

(57) ABSTRACT

A semiconductor device comprises a substrate, a first source/drain region on the substrate, a first channel region extending vertically with respect to the substrate from the first source/drain region, a second source/drain region on the first channel region, a third source/drain region on the second source/drain region, a second channel region extending vertically with respect to the substrate from the third source/drain region, a fourth source/drain region on the second channel region, a first gate region formed around from the first channel region, and a second gate region formed around the second channel region.

10 Claims, 16 Drawing Sheets

(56) References Cited

OTHER PUBLICATIONS

D.-S. Liang et al., "Novel Voltage-Controlled Oscillator Design by MOS-NDR Devices and Circuits," IEEE Fifth International Workshop on System-on-Chip for Real-Time Applications (IWSOC), Jul. 20-24, 2005, pp. 372-375, Banff, Alberta, Canada.
H. Takagi et al., "Complementary JFET negative-resistance devices," IEEE Journal of Solid-State Circuits, vol. 10, No. 6, 1975, pp. 509-515.
K. Ramkumar et al., "A Ternary Schmitt Trigger," IEEE Transactions on Circuits and Systems, Jul. 1985, pp. 732-735, vol. 32, No. 7.
J. Nunez et al., "Two-Phase Mobile Interconnection Schemes for Ultra-Grain Pipeline Applications," International Workshop on Power and Timing Modeling, Optimization and Simulations (PATMOS), 2012, pp. 166-174.

100

100

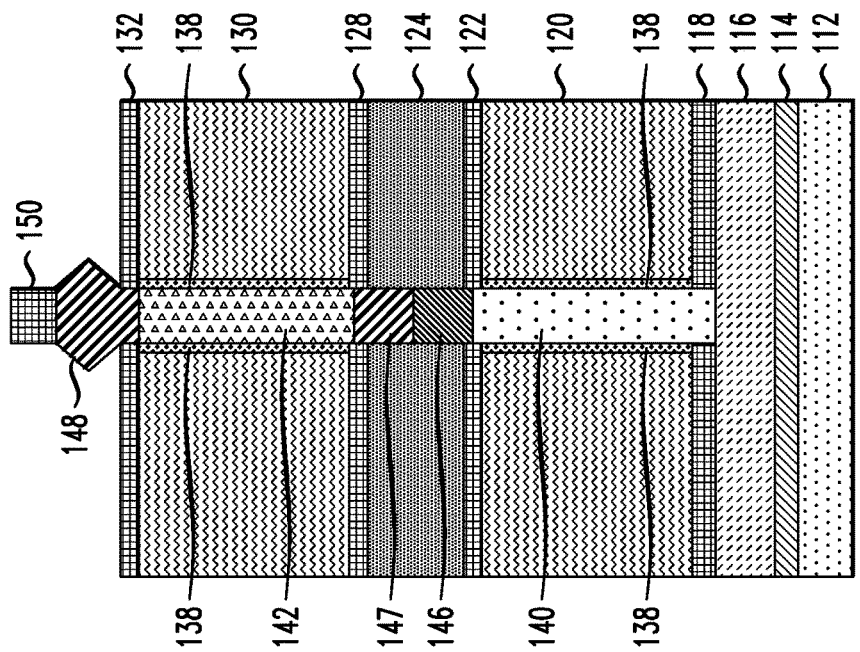
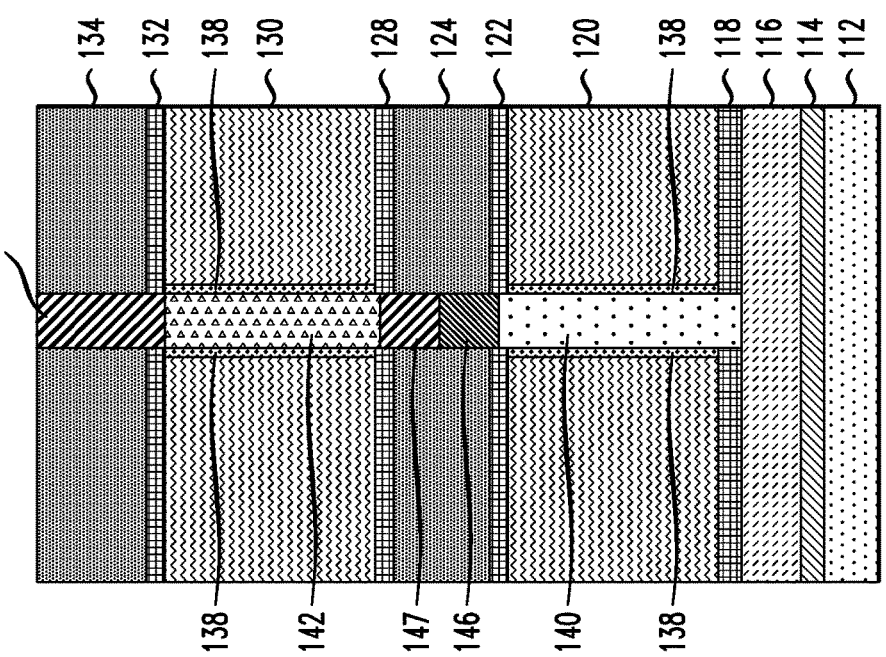

100

100

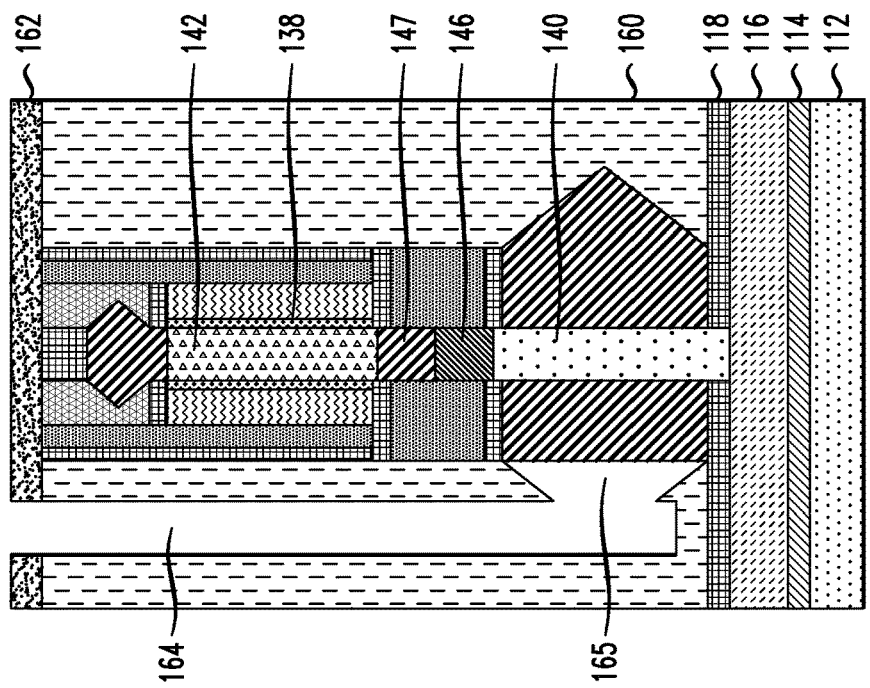
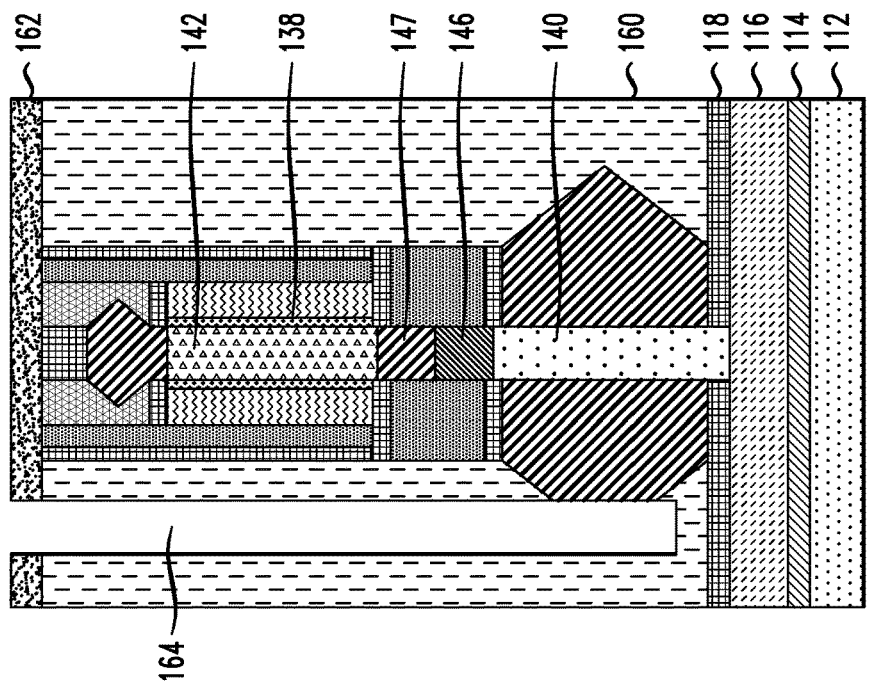

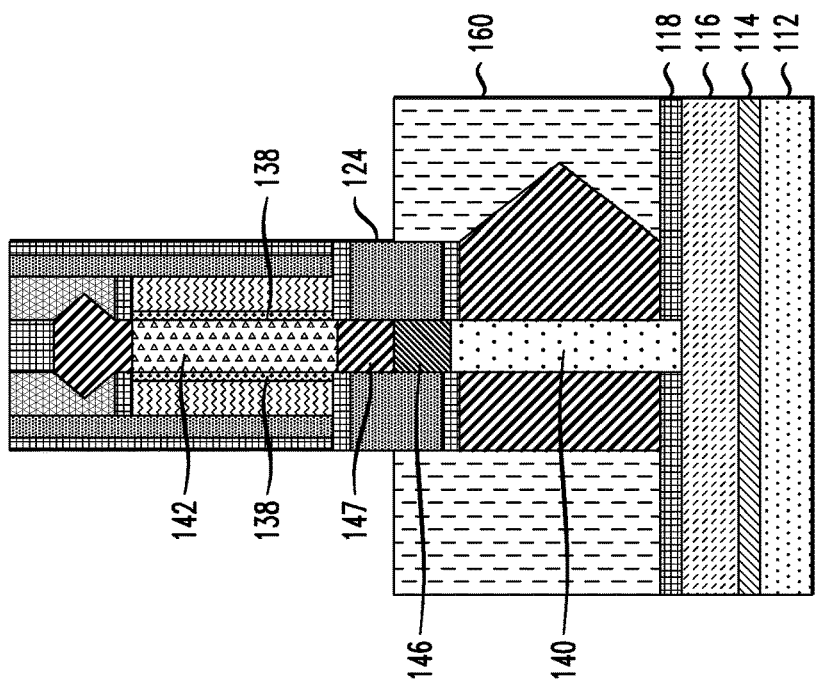
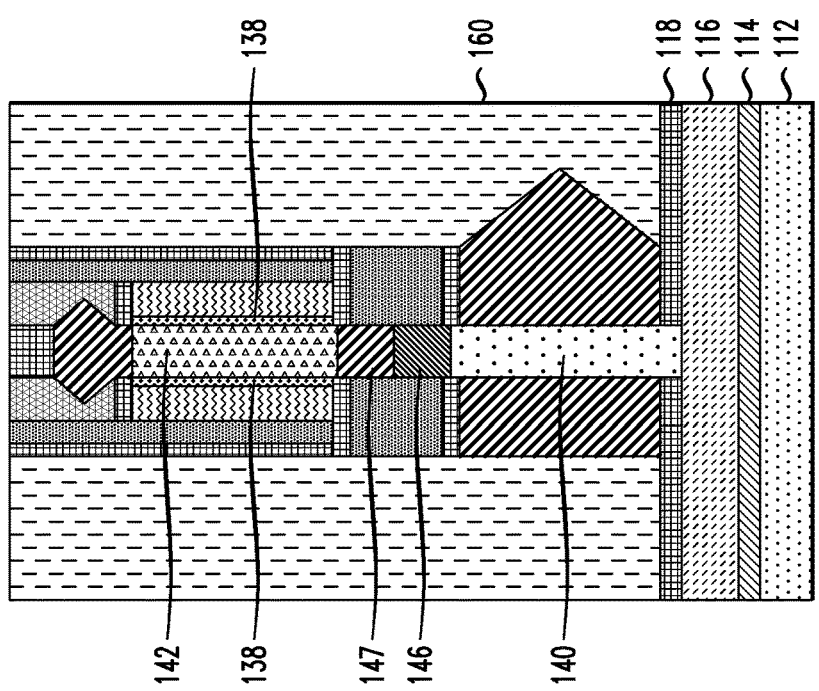

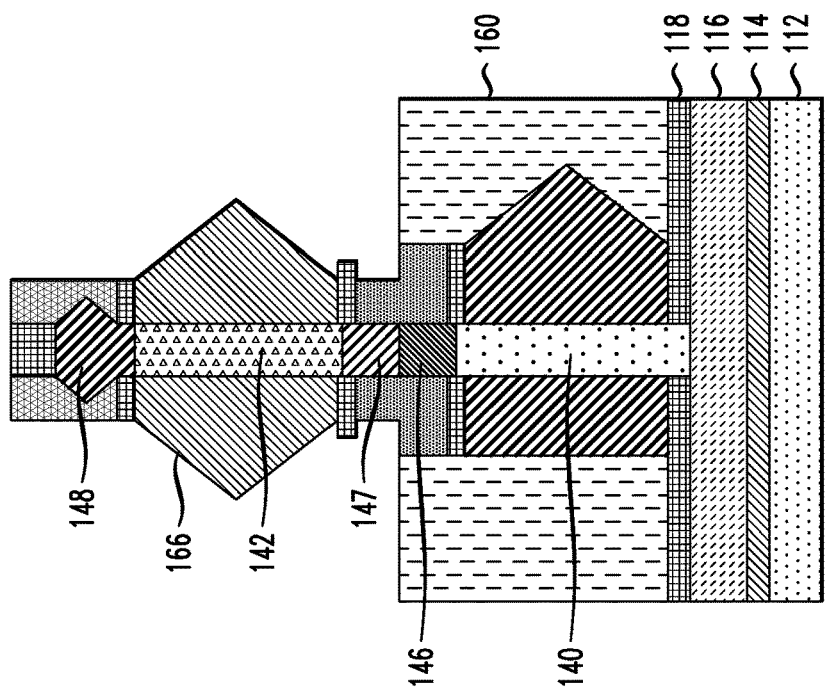
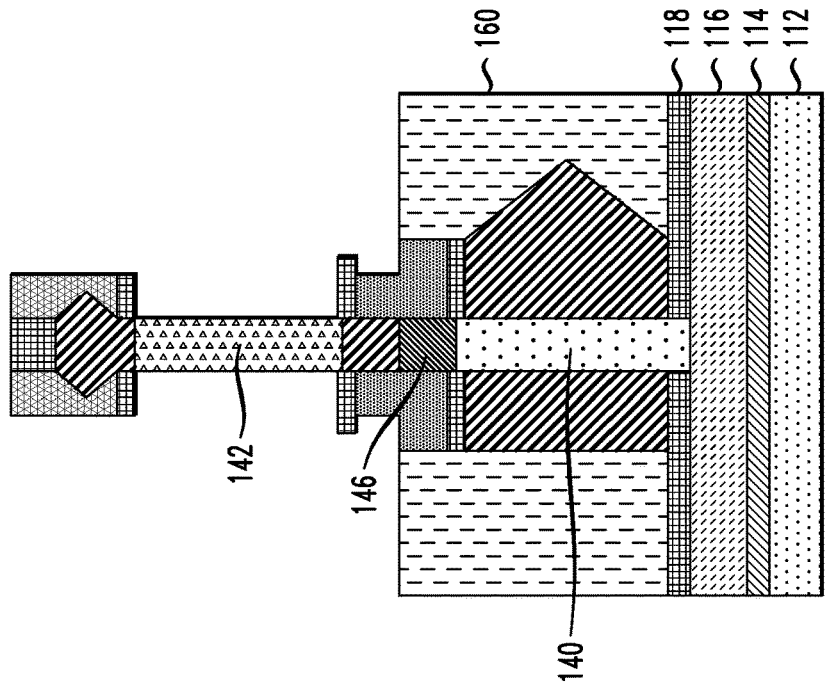

STACKED COMPLEMENTARY JUNCTION FETS FOR ANALOG ELECTRONIC CIRCUITS

BACKGROUND

Junction field-effect transistors (FETs) are semiconductor devices which exhibit low noise and high input impedance. As a result, junction FETs (JFETs) can be useful in such devices as low noise ring oscillators, as well as memory devices. The properties of junction FETs may also be useful for implementing operational amplifiers with high input-impedance and/or very high current-gain. Operational amplifiers can be viewed as essential building blocks of analog electronics. Low noise has also been deemed to be a critical factor in analog electronics, particularly in high precision computation.

Junction FETs can also be used to implement negative differential resistance (NDR) using what has been referred to as a "lambda-diode" structure. NDRs have many applications in analog electronics including, but not necessarily limited to, low-noise/high-gain amplifiers, low-noise buffers, voltage-controlled oscillators and bistable circuits such as Schmidt-triggers. Unlike conventional cascode amplifiers, NDR-based amplifiers do not require large overdrive voltages. NDR elements are also of interest in digital electronics.

Emerging mobile and Internet of Things (IoT) applications require low power devices. Larger battery driven IoT devices can also benefit from low noise and high input impedance while running on low voltage for certain applications.

There is also a renewed interest in the analog implementation of neural networks, which may be highly beneficial given efficient/low-power implementation of cognitive tasks such as pattern recognition and natural language processing.

There is a need, therefore, for an improved junction FET that is area efficient and operates with a relatively low voltage.

SUMMARY

Illustrative embodiments of the invention provide a stacked low voltage junction FET with an all-around junction gate, and techniques for fabricating the same.

According to an exemplary embodiment of the present invention, a semiconductor device comprises a substrate, a first junction field effect transistor (JFET) on the substrate, and a second JFET stacked on the first JFET, wherein the second JFET is oppositely doped from the first JFET.

According to an exemplary embodiment of the present invention, a method for manufacturing semiconductor device comprises forming a first source/drain region on the substrate, forming a first channel region extending vertically with respect to the substrate from the first source/drain region, forming a second source/drain region on the first channel region, forming a third source/drain region on the second source/drain region, forming a second channel region extending vertically with respect to the substrate from the third source/drain region, forming a fourth source/drain region on the second channel region, growing a first gate region from the first channel region, and growing a second gate region from the second channel region.

According to an exemplary embodiment of the present invention, a semiconductor device comprises a substrate, a first source/drain region on the substrate, a first channel region extending vertically with respect to the substrate from the first source/drain region, a second source/drain region on the first channel region, a third source/drain region on the second source/drain region, a second channel region extending vertically with respect to the substrate from the third source/drain region, a fourth source/drain region on the second channel region, a first gate region formed around from the first channel region, and a second gate region formed around the second channel region.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 5 is a schematic cross-sectional view illustrating manufacturing of a junction FET and showing epitaxial growth of a channel structure, according to an embodiment of the invention.

FIG. 6 is a schematic cross-sectional view illustrating manufacturing of a junction FET and showing oxide removal and epitaxial formation of a top source/drain region, according to an embodiment of the invention.

FIG. 15 is a schematic cross-sectional view illustrating manufacturing of a junction FET and showing formation of a contact trench, according to an embodiment of the invention.

FIG. 16 is a schematic cross-sectional view illustrating manufacturing of a junction FET and showing removal of a portion the first gate region by exposure to an etchant through the contact trench, according to an embodiment of the invention.

FIG. 17 is a schematic cross-sectional view illustrating manufacturing of a junction FET and showing filling the contact trench and the vacancy left by removal of the portion of the first gate region with an inter-layer dielectric (ILD) layer, according to an embodiment of the invention.

FIG. 18 is a schematic cross-sectional view illustrating manufacturing of a junction FET and showing recessing of the inter-layer dielectric (ILD) layer, according to an embodiment of the invention.

FIG. 21 is a schematic cross-sectional view illustrating manufacturing of a junction FET and showing removal of an oxide on a channel sidewall, according to an embodiment of the invention.

FIG. 22 is a schematic cross-sectional view illustrating manufacturing of a junction FET and showing epitaxial formation of a second gate region, according to an embodiment of the invention.

DETAILED DESCRIPTION

Figure 2:
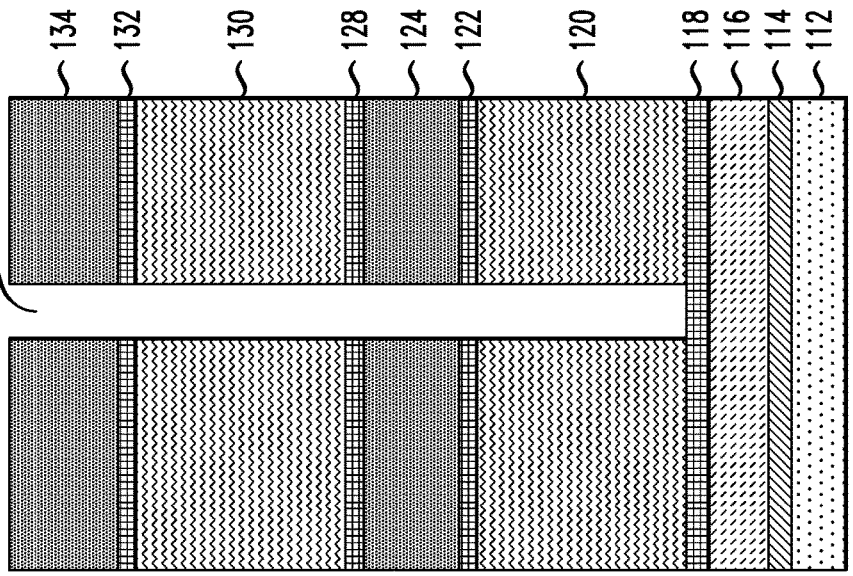
FIG. 2 is a schematic cross-sectional view illustrating manufacturing of a junction FET and showing removal of certain layers down to a bottom spacer layer, according to an embodiment of the invention.

In illustrative embodiments, junction FETs and techniques for fabricating the junction FETs are provided. More particularly, illustrative embodiments relate to vertical junction FETS with dual-, tri- or all-around junction gates, which, with respect to conventional structures, effectively cut the voltage requirement to control the junction in half or less. By having a gate on both sides of a channel only half (or less, due to tri- or all-around gate structures) of the voltage when compared with a single gate structure, is needed to turn the current flow on or off in the junction FET. This enables low power/lower voltage applications of junction FETs and significantly reduces area consumption.

Area-efficient and low power/lower voltage applications of junction FETs can be used when implementing, for example, negative differential resistance (NDR). Typically, NDR is observed in non-Si-based devices such as memristors and resonant tunneling diodes, which are not compatible with standard very-large scale integration (VLSI) technology.

Implementation of NDR with standard very-large scale integration (VLSI) technology requires at least 3 transistors and a supply bias. Other implementations may require more transistors. A stacked junction FET in accordance with an embodiment of the present invention can be implemented with 2 transistors. In addition, the herein identified benefits of junction FETs (e.g. low-noise, high impedance) are appealing for analog circuit applications.

Vertical FET (VFET) devices include channels (e.g., fin channels) with source/drain regions at ends of the channels on top and bottom sides of the channel regions. Current runs through the channels in a vertical direction (e.g., perpendicular to a substrate), for example, from a bottom source/drain region to a top source/drain region.

It is to be understood that embodiments discussed herein are not limited to the particular materials, features, and processing steps shown and described herein. In particular, with respect to fabrication (forming or processing) steps, it is to be emphasized that the descriptions provided herein are not intended to encompass all of the steps that may be used to form a functional integrated circuit device. Rather, certain steps that are commonly used in fabricating such devices are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about," "approximately" or "substantially" as used herein with regard to thicknesses, widths, percentages, ranges, etc., are meant to denote being close or approximate to, but not exactly. For example, the term "about" or "substantially" as used herein implies that a small margin of error is present such as, by way of example only, 1% or less than the stated amount.

In the figures, the illustrated scale of one layer, structure, and/or region relative to another layer, structure, and/or region is not necessarily intended to represent actual scale. One or more layers and/or regions of a type commonly used in, for example, a junction FET, a complementary metal-oxide semiconductor (CMOS), nanowire FET, fin field-effect transistor (FinFET), metal-oxide-semiconductor field-effect transistor (MOSFET), vertical FET (VFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, junction FETs, VFETs, nanowire FETs, CMOSs, MOSFETs and/or FinFETs. By way of non-limiting example, the semiconductor devices can include, but are not limited to junction FET, VFET, nanowire FET, CMOS, MOSFET and FinFET devices, and/or semiconductor devices that use junction FET, CMOS, MOSFET, VFET, nanowire FET, and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the cross-sectional views measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Figure 1:
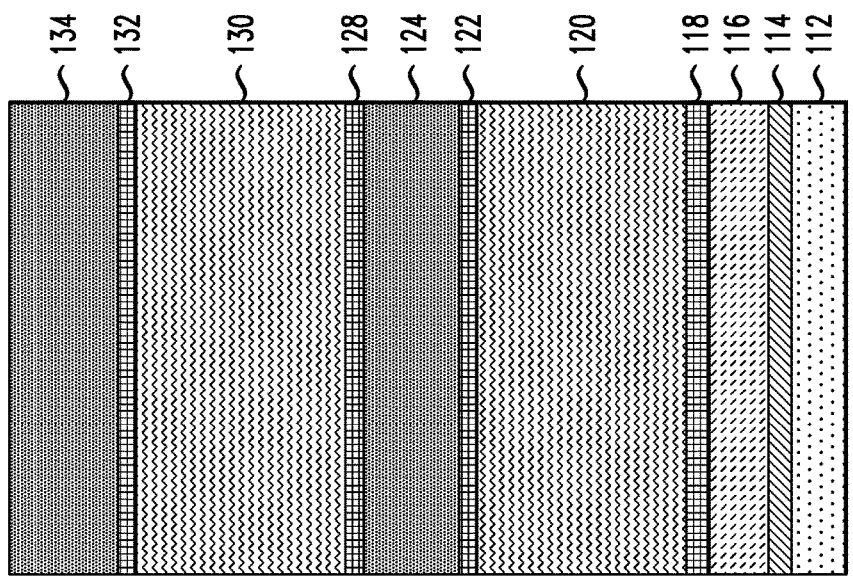
FIG. 1 is a schematic cross-sectional view illustrating manufacturing of a junction FET and showing formation of a bottom source/drain region, spacer layers and sacrificial layers, according to an embodiment of the invention.

FIG. 1 is a schematic cross-sectional view illustrating manufacturing of a junction FET and showing formation of a bottom source/drain region, spacer layers and sacrificial layers, according to an embodiment of the invention. For the purpose of clarity, illustration of some fabrication steps leading up to the production of the semiconductor structure 100 as illustrated in FIG. 1 have been omitted.

Semiconductor structure 100 in FIG. 1 is shown having a vertical structure comprising a substrate 112. In one embodiment, a semiconductor substrate 112 includes semiconductor material including, but not necessarily limited to, silicon (Si), silicon germanium (SiGe), silicon carbide (SiC), Si:C (carbon doped silicon), silicon germanium carbide (SiGe:C), carbon doped silicon germanium (SiGe:C), III-V, II-V compound semiconductor or other like semiconductor. In addition, multiple layers of the semiconductor materials can be used as the semiconductor material of the substrate. The semiconductor substrate 112 can be a bulk substrate or a silicon-on-insulator (SOI) substrate including a buried insulating layer, such as, for example, a buried oxide or nitride layer.

Formed on substrate 112 is a counter-doped layer 114. One way to form such layer is epitaxy. A counter doped layer 114 is epitaxially grown and can be formed using in-situ doped epitaxy to create the counter-doped layer 114 acting as a punchthrough stop (PTS) layer. The counter-doped layer 114 comprises, for example, doped silicon and is doped differently (i.e., opposite doping of source/drain doping) from the source/drain region (e.g., heavily doped source/drain layer 116) in order to prevent leakage current. For example, in a non-limiting illustrative example, the doping of the counter-doped layer 114 uses, for example, arsenic (As) or phosphorous (P) for p-type and boron (B) for n-type, at concentrations in the general range of $5e18/cm^3$ to $5e19/cm^3$ to stop the leakage. A thickness of the counter-doped layer 114 can be approximately 10 nm to about 100 nm.

A heavily doped source/drain layer 116 is epitaxially grown on counter-doped layer 114. The heavily doped source/drain layer 116 can be formed by a bottom-up epitaxial growth process, wherein the heavily doped source/drain layer 116 is grown to certain height (thickness) such as, but not necessarily limited to from about 50 nm to about 250 nm, with about 100 nm to about 200 nm preferred. The epitaxially grown source/drain layer 116 can be doped using processes, such as, for example, in situ, and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $e20/cm^3$ to $e21/cm^3$, with $4e20/$ cm³ to 8e20/cm³ preferred. The source/drain layer 116 can include, but is not necessarily limited to, silicon (Si), silicon germanium (SiGe), or other semiconductor material.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a low pressure chemical vapor deposition (LPCVD) apparatus. A number of different precursors may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, disilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. The temperature for epitaxial silicon germanium deposition typically ranges from 450° C. to 900° C. Although higher temperature typically results in faster deposition, the faster deposition may result in crystal defects and film cracking.

By "in-situ" it is meant that the dopant that dictates the conductivity type of doped layer is introduced during the process step, e.g., epitaxial deposition, that forms the doped layer.

A bottom spacer layer 118 is then deposited on heavily doped source/drain layer 116. The spacer layer 118 includes, but is not necessarily limited to, low-K dielectric layers, including, but not necessarily limited to, a nitride, such as, SiBCN, SiOCN, or SiN, deposited using, for example, directional deposition techniques, including, but not necessarily limited to high density plasma (HDP) deposition and gas cluster ion beam (GCIB) deposition, or deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering.

A first sacrificial placeholder layer 120, comprising, for example, amorphous silicon (a-Si), is deposited on the bottom spacer layer 118 using, for example, deposition techniques including, but not limited to, CVD, PECVD, RFCVD, PVD, ALD, MLD, MBD, PLD, LSMCD, and/or sputtering. A first middle spacer layer 122 is deposited on the top surface of first sacrificial layer 120, followed by a first oxide layer 124 on the first middle spacer layer 122, and a second middle spacer layer 128 on the first oxide layer 124. The first and second middle spacer layers 122 and 128 include, but are not necessarily limited to, low-K dielectric layers, including, but not necessarily limited to, a nitride, such as, SiBCN, SiOCN, or SiN, deposited using, for example, directional deposition techniques, including, but not necessarily limited to high density plasma (HDP) deposition and gas cluster ion beam (GCIB) deposition, or deposition techniques including, but not limited to, CVD, PECVD, RFCVD, PVD, ALD, MLD, MBD, PLD, LSMCD, and/or sputtering.

A second sacrificial placeholder layer 130, comprising, for example, amorphous silicon (a-Si), is deposited on the second middle spacer layer 128 using, for example, deposition techniques including, but not limited to, CVD, PECVD, RFCVD, PVD, ALD, MLD, MBD, PLD, LSMCD, and/or sputtering. A top spacer layer 132 is deposited on the top surface of second sacrificial layer 130, followed by a second oxide layer 134 on the top spacer layer 132. Like the bottom, first middle and second middle spacer layers 118, 122 and 128, the top spacer layer 132 includes, but is not necessarily limited to, a nitride, such as, SiBCN, SiOCN, or SiN, deposited using, for example, directional deposition techniques, including, but not necessarily limited to high density plasma (HDP) deposition and gas cluster ion beam (GCIB) deposition, or deposition techniques including, but not limited to, CVD, PECVD, RFCVD, PVD, ALD, MLD, MBD, PLD, LSMCD, and/or sputtering.

The first and second oxide layers 124 and 134 comprise, but are not necessarily limited to, an oxide, such as, silicon dioxide ($SiO_2$), and can be deposited using the same or similar deposition techniques to those which can be used for the spacer layers 118, 122, 128 and 132.

FIG. 2 is a schematic cross-sectional view illustrating manufacturing of a junction FET and showing removal of certain layers down to a bottom spacer layer, according to an embodiment of the invention. Referring to FIG. 2, an etch process, such as, for example, an anisotropic etch process, including, but not limited to, a reactive ion etch (RIE) process, is performed to form trench 136 through the first and second oxide layer 124 and 134, first middle, second middle and top spacer layers 122, 128 and 132 and first and second sacrificial layers 120 and 130 down to the bottom spacer layer 118.

Figure 3:
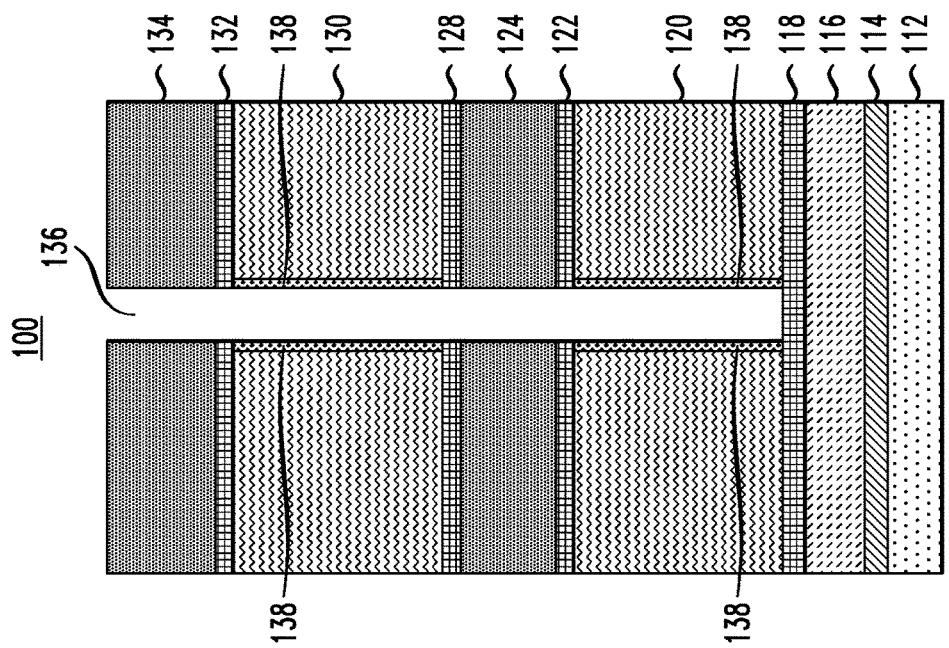
FIG. 3 is a schematic cross-sectional view illustrating manufacturing of a junction FET and showing oxide formation on portions of sacrificial layers, according to an embodiment of the invention.

FIG. 3 is a schematic cross-sectional view illustrating manufacturing of a junction FET and showing oxide formation on portions of sacrificial layers, according to an embodiment of the invention. As illustrated in FIG. 3, a thin oxide 138 is formed on the exposed surfaces of the sacrificial layers 120 and 130 exposed by trench 136, between the second middle and top spacers 128 and 132, and between the bottom and first middle spacers 118 and 122. Plasma or another method of oxidation, may be utilized to form the thin oxide layer 138 on the exposed surfaces of the sacrificial layers 120 and 130. During subsequent growth of channel material described herein, the oxide 138 prevents lateral growth of channel material, so that channel material can be epitaxially grown in a bottom-up process from the source/drain layer 116.

Figure 4:
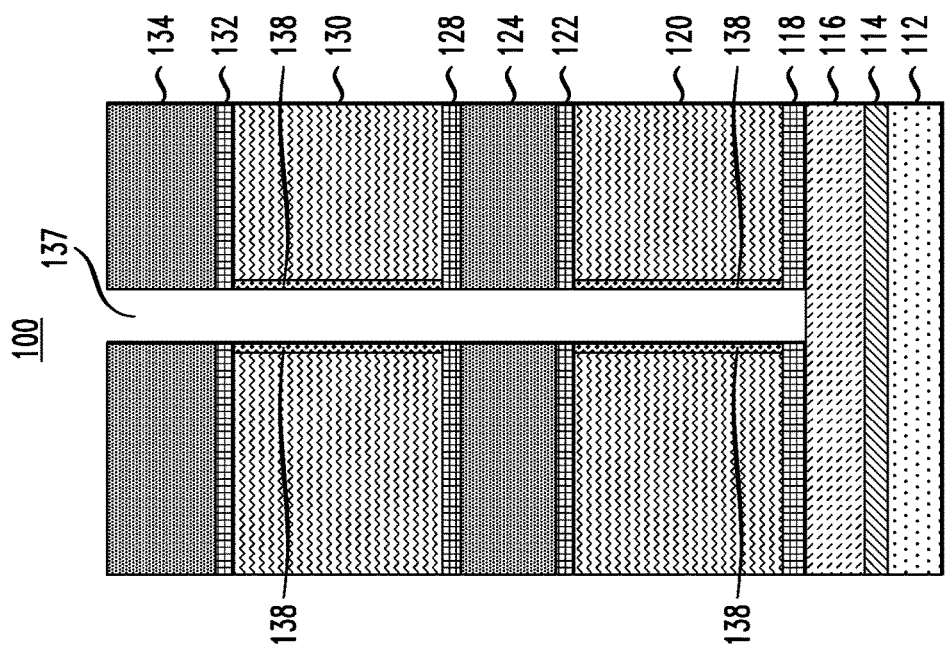
FIG. 4 is a schematic cross-sectional view illustrating manufacturing of a junction FET and showing removal of a portion of a bottom spacer, according to an embodiment of the invention.

Referring to FIG. 4, following the formation of the oxide 138, trench 136 is further etched, using, for example, RIE, through the bottom spacer 118 selective to the heavily doped source/drain layer 116 to form trench 137, which is deeper than trench 136, providing a self-aligned junction to a source.

FIG. 5 is a schematic cross-sectional view illustrating manufacturing of a junction FET and showing epitaxial growth of a channel structure, according to an embodiment of the invention. Layers 140, 142, 146, 147 and 148 are epitaxially grown, where each of these layers can include, but is not necessarily limited to, silicon (Si), silicon germanium (SiGe), or other semiconductor material. The epitaxially grown layers 140, 142, 146, 147 and 148 can be doped using processes, such as, for example, in situ doping during epitaxial growth, and dopants may include, for example, an n-type dopant selected from a group V element hydride including, but not limited to, arsine ($AsH_3$), and phosphine ($PH_3$), and a p-type dopant selected from a group III element hydride, including, but not limited to, diborane gas at various concentrations.

According to an embodiment of the present invention, layer 140 includes low p-type doped silicon and forms a P-JFET channel, and layer 142 includes low n-type doped silicon and forms an N-JFET channel. A dopant concentration range for layers 140 and 142 may be in the range of about $1e16/cm^3$ to about $1e19/cm^3$, with the range of about $1e17/cm^3$ to about $1e19/cm^3$ being preferred. The layer 146 is a higher p-type doped layer (e.g., p++), for example, in-situ boron doped Si or SiGe at a concentration of about $e20/cm^3$ to about $e21/cm^3$, with about $4e20/cm^3$ to about $8e20/cm^3$ preferred. The layer 146 functions as a top source/drain of the P-JFET including the P-JFET channel 140. The layers 147 and 148 are higher n-type doped layers (e.g., n++), for example, in-situ phosphorus doped Si at a concentration of about $e20/cm^3$ to about $e21/cm^3$, with about $4e20/cm^3$ to about $8e20/cm^3$ preferred. The layers 147 and 148 function as bottom and top source/drain regions, respectively, of the N-JFET including the N-JFET channel 142.

An overgrowth of the semiconductor material from layer 148 may form above the top surface of the oxide layer 134 during the epitaxial growth process. The overgrowth may be removed by polishing the surface back to the oxide using, for example, chemical mechanical planarization (CMP).

FIG. 6 is a schematic cross-sectional view illustrating manufacturing of a junction FET and showing oxide removal and epitaxial formation of a top source/drain region, according to an embodiment of the invention. According to an embodiment, a portion of the layer 148 is recessed into oxide layer 134 in trench 137 and the vacant portion filled with a dielectric material, such as, for example, a nitride layer 150, including, but not necessarily limited to, SiN, SiBCN and/or SiOCN. The nitride layer 150 is formed by deposition techniques including, but not limited to, CVD, PECVD, RFCVD, PVD, ALD, MLD, MBD, PLD, LSMCD, and/or sputtering. Any excess nitride formed above the top surface of oxide 134 is removed utilizing a planarization process, such as CMP, for example.

Then, the remaining oxide layer 134 is removed, exposing the top surface of top spacer layer 132, as well as side portions of the nitride layer 150 and of layer 148 above the top surface of top spacer layer 132. An etch process selectively removing the oxide 134 with respect to the nitride layer 140 and semiconductor layer 148 can be performed down to the top spacer layer 132.

Figure 7:
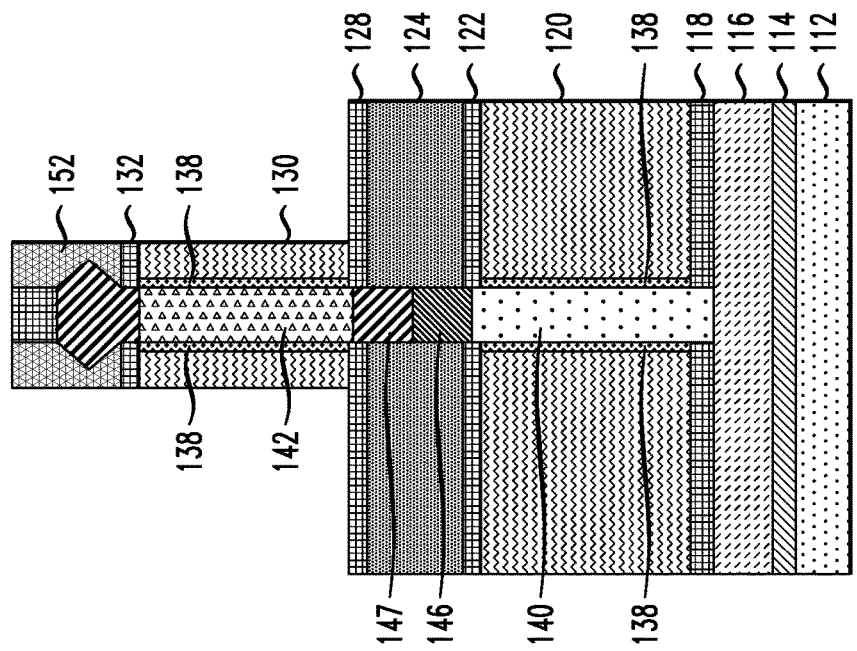
FIG. 7 is a schematic cross-sectional view illustrating manufacturing of a junction FET and showing formation of a spacer protecting the top source/drain region, according to an embodiment of the invention.

Following the removal of oxide layer 134, further epitaxial growth is performed to increase the area of layer 148, which functions as a top source/drain region of the N-JFET including the N-JFET channel 142. Following the epitaxial growth to increase the area of layer 148, referring to FIG. 7, a nitride spacer 152 including, but not necessarily limited to, SiN, SiBCN and/or SiOCN, is formed on the top spacer layer 132 and around expanded semiconductor region 148 and nitride layer 150 to protect layer 148 during subsequent etching as described herein. The nitride spacer 152 is deposited using, for example, directional deposition techniques, including, but not necessarily limited to a CVD or PVD nitride deposition followed by spacer etch.

Figure 8:
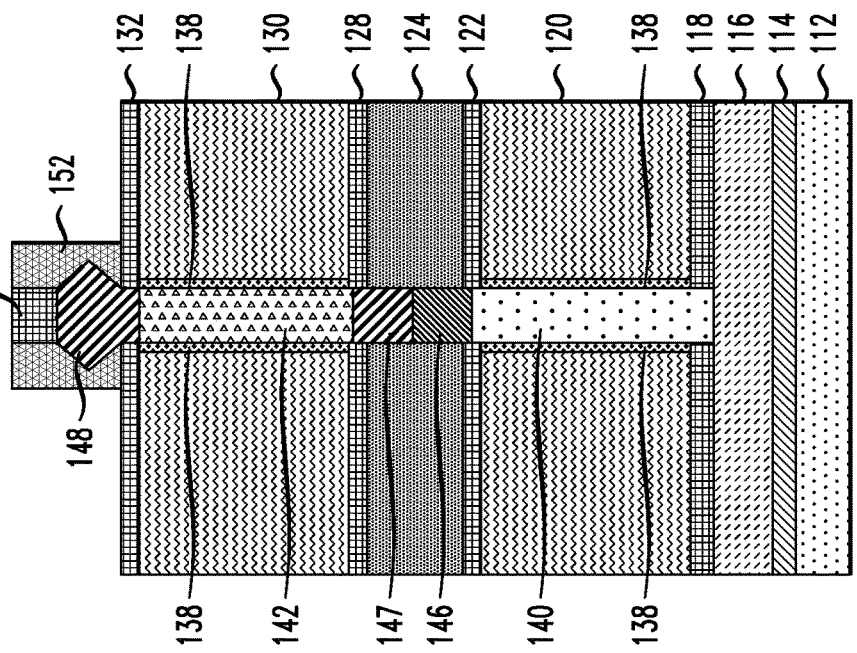
FIG. 8 is a schematic cross-sectional view illustrating manufacturing of a junction FET and showing removal down to an upper middle spacer of layers not covered by the spacer protecting the top source/drain region, according to an embodiment of the invention.

FIG. 8 is a schematic cross-sectional view illustrating manufacturing of a junction FET and showing removal down to the second (e.g., upper) middle spacer 128 of layers not covered by the spacer 152 protecting the layer 148, according to an embodiment of the invention. Referring to FIG. 8, an etch process, such as for example RIE, is used to remove portions of the top spacer 132 and second (e.g., upper) sacrificial material layer 130 not covered by spacer 152, which functions as a hard mask during the etching.

Figure 9:
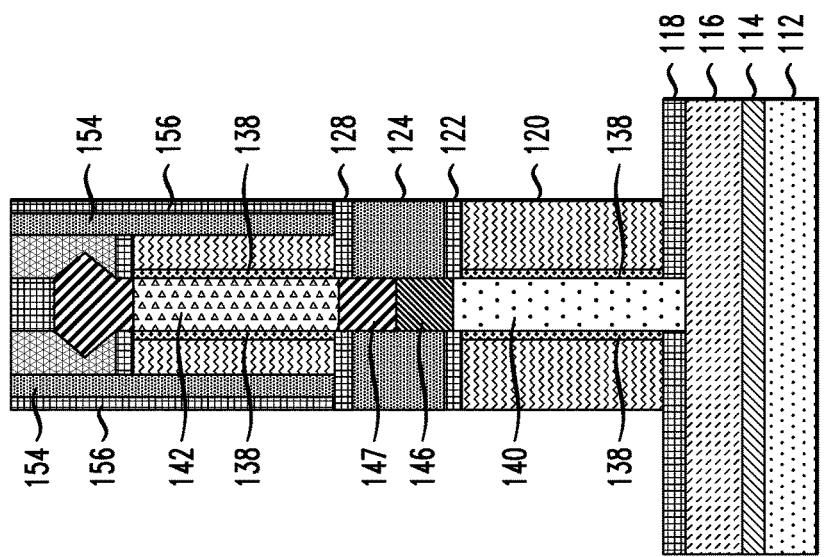
FIG. 9 is a schematic cross-sectional view illustrating manufacturing of a junction FET and showing formation of a dual sidewall spacer to protect upper sacrificial material, according to an embodiment of the invention.

FIG. 9 is a schematic cross-sectional view illustrating manufacturing of a junction FET and showing formation of a dual sidewall spacer to protect upper sacrificial material, according to an embodiment of the invention. Referring to FIG. 9, a dual sidewall spacer including an oxide sidewall 154 and a nitride sidewall 156 is formed to protect the second (e.g., upper) sacrificial material layer 130. The oxide can include, but is not necessarily limited to, silicon dioxide ($SiO_2$), and the nitride can include, but is not necessarily limited to, SiN, SiBCN and/or SiOCN.

Figure 10:
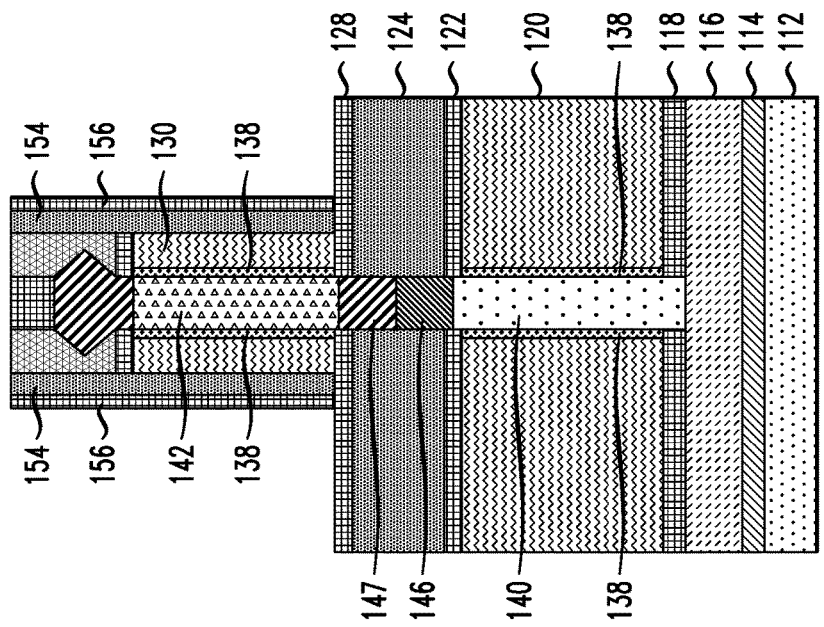
FIG. 10 is a schematic cross-sectional view illustrating manufacturing of a junction FET and showing removal down to a bottom spacer of layers not covered by the spacer protecting the top source/drain region and the dual sidewall spacer protecting the upper sacrificial material, according to an embodiment of the invention.

FIG. 10 is a schematic cross-sectional view illustrating manufacturing of a junction FET and showing removal down to a bottom spacer 118 of layers not covered by the spacer 152 protecting the top source/drain region and the dual sidewall spacer 154, 156 protecting the upper sacrificial material 130, according to an embodiment of the invention. Referring to FIG. 10, an etch process, such as, for example, an anisotropic etch process, including, but not limited to, a reactive ion etch (RIE) process, is performed to the first oxide layer 124, first and second middle spacer layers 122 and 128, and first sacrificial layer 120 stopping at the bottom spacer layer 118. The exposed portions of the layers 120, 122, 124 and 128 are etched using the epitaxy protecting spacer 152 and the upper sacrificial material spacers 154, 156 as a hard mask.

Figure 11:
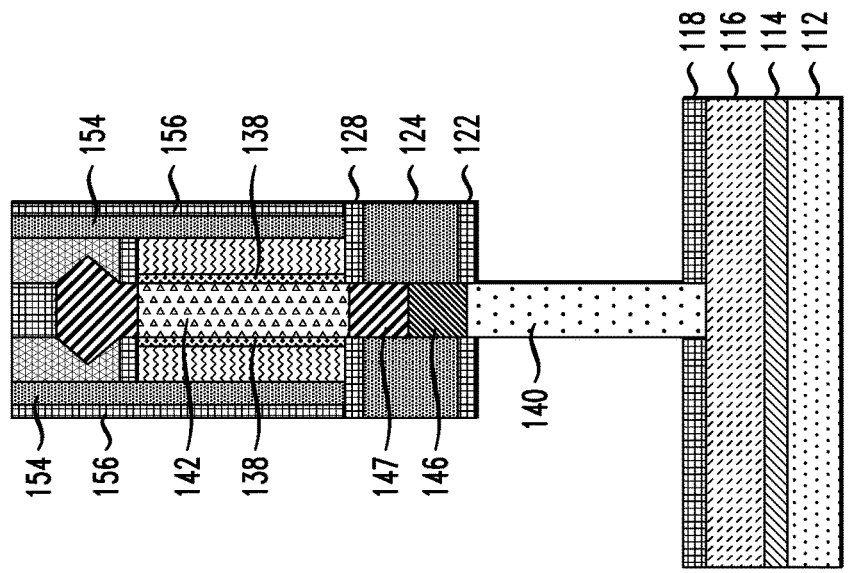
FIG. 11 is a schematic cross-sectional view illustrating manufacturing of a junction FET and showing removal of bottom sacrificial material, according to an embodiment of the invention.

Referring to FIG. 11, following the etching process described in connection with FIG. 10, the remainder of the sacrificial material 120 is removed, using, for example, an etching process that selectively removes the sacrificial material 120 (e.g., silicon) with respect to, for example, nitride, which can be the material of the spacer layers 156, 128, 122 and 118, and with respect to the first oxide layer 124.

Figure 12:
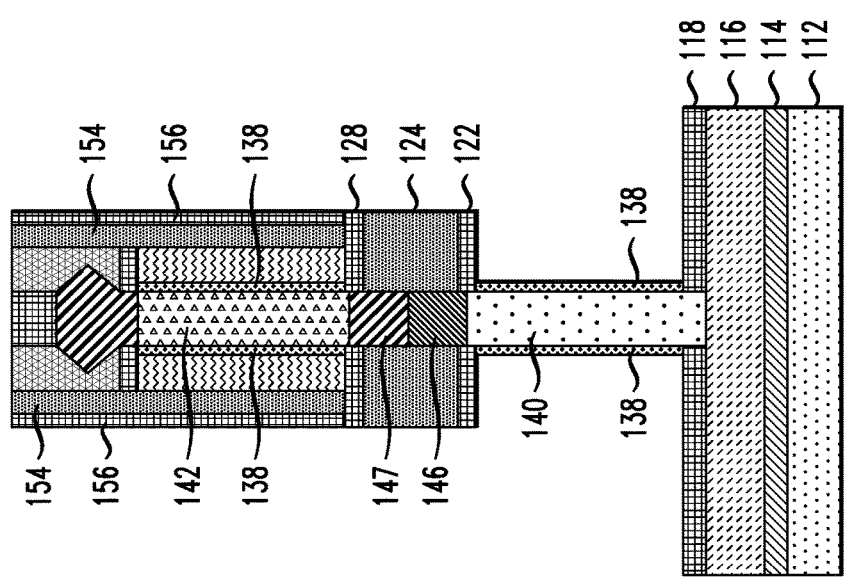
FIG. 12 is a schematic cross-sectional view illustrating manufacturing of a junction FET and showing removal of an oxide on a channel sidewall, according to an embodiment of the invention.

Referring to FIG. 12, following the removal of sacrificial material 120, the oxide 138 on the channel sidewall is removed using, for example, a SiCoNi epitaxial pre-cleaning process performed prior to gate on channel epitaxy described in connection with FIG. 13. A SiCoNi pre-clean can include a plasma-based cleaning chemistry to gently remove oxide at temperatures, for example, less than about 130° C. The SiCoNi pre-clean can include simultaneous exposure to $H_2$, $NF_3$ and $NH_3$ plasma by-products. The SiCoNi pre-clean process is largely conformal and selective towards silicon oxide layers but does not readily etch silicon regardless of whether the silicon is amorphous, crystalline or polycrystalline.

Figure 13:
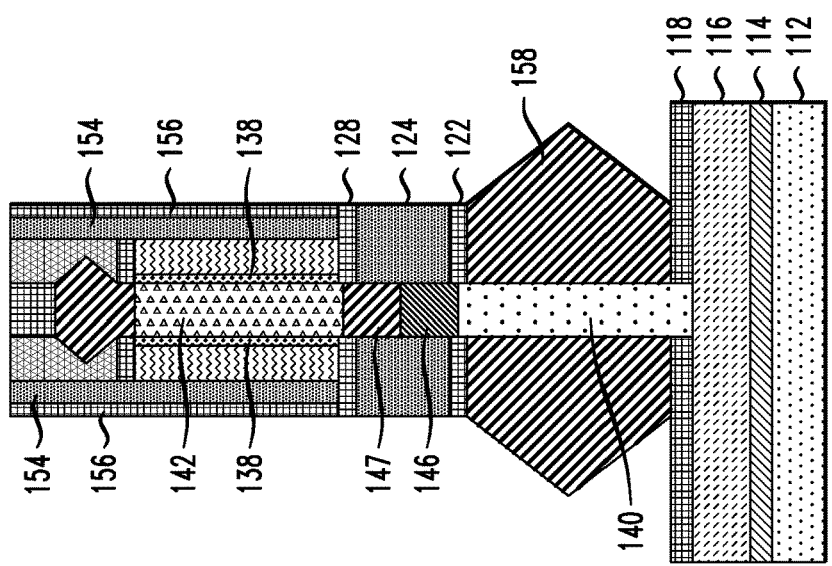
FIG. 13 is a schematic cross-sectional view illustrating manufacturing of a junction FET and showing epitaxial formation of a first gate region, according to an embodiment of the invention.

FIG. 13 is a schematic cross-sectional view illustrating manufacturing of a junction FET and showing epitaxial formation of a first gate region, according to an embodiment of the invention. Referring to FIG. 13, an all-around gate 158 surrounding the channel region 140 on all sides is formed on the channel region 140. The gate region 158 can be formed by a gate on channel epitaxy process, where highly doped semiconductor material forming the gate is epitaxially grown onto the outer surface of the channel region 140. Referring to FIG. 13, given a channel surface having <110> oriented planes, a diamond shaped epitaxial gate structure will form, which is bound by <111> oriented planes. In other embodiments, dual- or tri-gate structures can be formed as an alternative to all-around gates.

The epitaxially grown gate region 158 can be in-situ doped during epitaxial growth processes, and dopants may include, for example, an n-type dopant selected from a group V element hydride including, but not limited to, arsine ($AsH_3$), and phosphine ($PH_3$), and a p-type dopant selected from a group III element hydride, including, but not limited to, diborane gas at various concentrations. For example, in a non-limiting example, a dopant concentration range may be e19/$cm^3$ to e20/$cm^3$, from 1e19/$cm^3$ to 4e20/$cm^3$ preferred. The gate region 158 can include, but is not necessarily limited to, silicon (Si), silicon germanium (SiGe), or other semiconductor material.

The bottom channel region 140, as well as the source/drain region 116 and layer 146, which functions as a top source/drain of the JFET including the channel 140, are doped with a first type doping, which may be either a p-type doping or an n-type doping. The gate region 158 is doped with a second type doping, which may be either an n-type doping or a p-type doping, opposite to the doping of the channel region 140, and the regions 116 and 146. A pn junction between the gate and the channel is thereby formed. In one embodiment, as noted hereinabove, a p-channel JFET is formed when the channel 140, source 116 and drain 146 are p-type doped and the gate 158 is n-type doped. In another embodiment, an n-channel junction FET is formed when the channel, source and drain are n-type and the gate is p-type doped.

In addition, relative to each other in terms of concentration, in accordance with an embodiment of the present invention, the source/drain regions 116 and 146 can be the same or more heavily doped than the gate region 158, and the gate region 158 can be more heavily doped than the channel region 140. For example, a resulting structure can have heavily doped (e.g., p++) source/drain regions 116 and 146, a heavily doped (e.g., n++) gate region 158, and a low doped (e.g., p) channel region 140.

Figure 14:
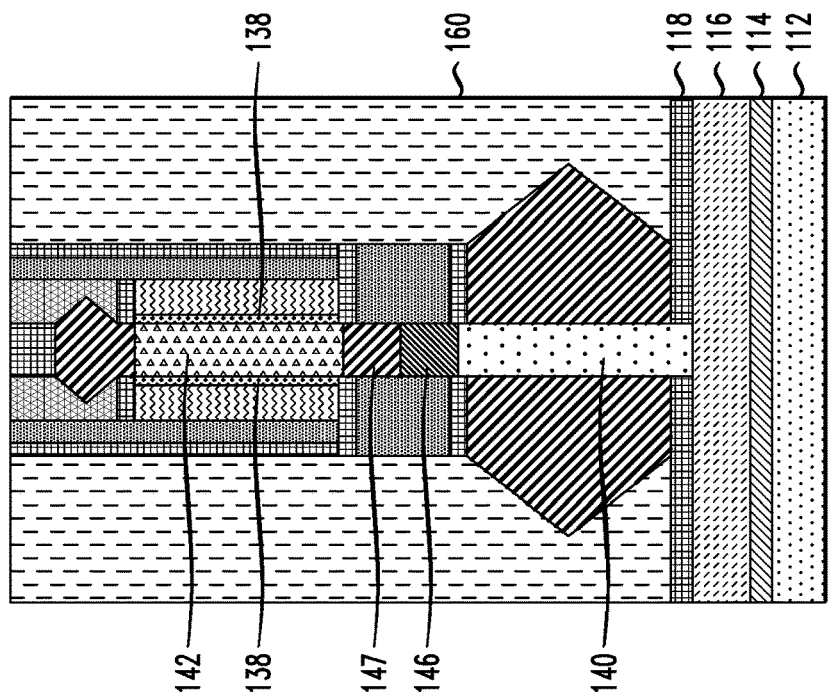
FIG. 14 is a schematic cross-sectional view illustrating manufacturing of a junction FET and showing formation of an inter-layer dielectric (ILD) layer, according to an embodiment of the invention.

FIG. 14 is a schematic cross-sectional view illustrating manufacturing of a junction FET and showing formation of an inter-layer dielectric (ILD) layer, according to an embodiment of the invention. Referring to FIG. 14, the space around the junction FET structure, above the bottom spacer 118, is filled with an ILD layer 160. The ILD layer 160 can be deposited using deposition techniques including, but not limited to, CVD, PECVD, RFCVD, PVD, ALD, MLD, MBD, PLD, LSMCD, and/or sputtering, followed by planarization by, for example, CMP, down to the nitride layer 150. The ILD layer 160 can include, but is not necessarily limited to, silicon dioxide ($SiO_2$), low-temperature oxide (LTO), high-temperature oxide (HTO), field oxide (FOX) or some other dielectric.

FIG. 15 is a schematic cross-sectional view illustrating manufacturing of a junction FET and showing formation of a contact trench, according to an embodiment of the invention. A hard mask 162 comprising, for example, silicon nitride (SiN), covers portions of the ILD layer 160, and leaves exposed a portion of the ILD layer 160 corresponding to a left side of the gate region 158 to form a left contact trench 164, down to the gate region 158, stopping at the bottom spacer 118 or above the bottom spacer using a timed etch process, such as, for example, RIE.

FIG. 16 is a schematic cross-sectional view illustrating manufacturing of a junction FET and showing removal of a portion the first gate region 158 by exposure to an etchant through the contact trench 164, according to an embodiment of the invention. Referring to FIG. 16, a lateral etch of the gate region 158, for example, an HCl gas etch, is performed from the exposed side of the gate region 158 through the contact trench 164 to remove a portion of the gate region 158 to create a vacant area 165. As described further herein in connection with FIG. 27A, the portion of the gate region 158 is removed to prevent contact between the gate region 158 and a source/drain contact 184.

FIG. 17 is a schematic cross-sectional view illustrating manufacturing of a junction FET and showing filling the contact trench 164 and the vacancy 165 left by removal of the portion of the first gate region 158 with an inter-layer dielectric (ILD) layer, according to an embodiment of the invention. Referring to FIG. 17, ILD material is deposited to fill the contact trench 164 and the vacancy 165. The ILD material can be deposited using deposition techniques including, but not limited to, CVD, PECVD, RFCVD, PVD, ALD, MLD, MBD, PLD, LSMCD, and/or sputtering, followed by planarization by, for example, CMP. The ILD material can include the same or similar material to that of ILD layer 160. The mask 162 is removed, and the removal can be followed by a planarization. As can be seen in FIG. 17, as a result of the removal of a portion of the gate region 158, a shape of the first gate region 158 extending from the channel 140 differs between left and right sides of the channel 140.

FIG. 18 is a schematic cross-sectional view illustrating manufacturing of a junction FET and showing recessing of the inter-layer dielectric (ILD) layer, according to an embodiment of the invention. Referring to FIG. 18, the ILD layer 160 is recessed down to a level at about the middle of the first oxide layer 124. The recessing can be performed using a timed etch process, such as, for example, RIE.

Figure 19:
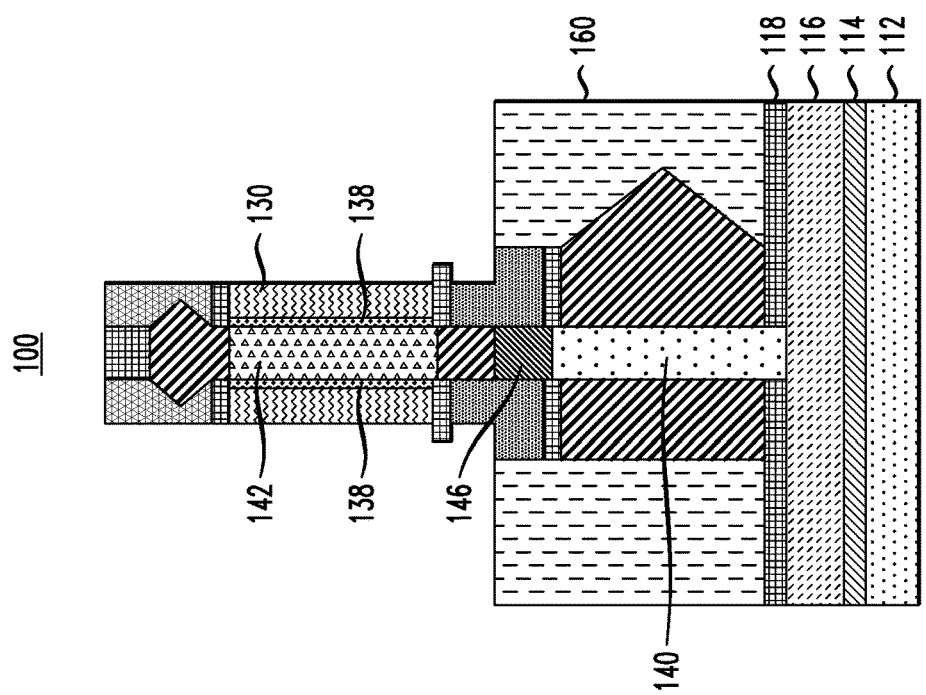
FIG. 19 is a schematic cross-sectional view illustrating manufacturing of a junction FET and showing removal of the dual sidewall spacer, according to an embodiment of the invention.

FIG. 19 is a schematic cross-sectional view illustrating manufacturing of a junction FET and showing removal of the dual sidewall spacer, according to an embodiment of the invention. Referring to FIG. 19, the dual sidewall spacer including an oxide sidewall 154 and a nitride sidewall 156 protecting the second (e.g., upper) sacrificial material layer 130 is removed. In accordance with an embodiment of the present invention, the nitride sidewall spacer 156, which can be, for example, about 2 nm to about 3 nm wide in a direction horizontal to the substrate, and the oxide sidewall spacer 154, which can be, for example, about 4 nm wide in a direction horizontal to the substrate, are removed by, for example, etching. During etching, as shown in FIG. 19, some loss of the ILD layer 160 and gap dielectric material (e.g., oxide 124) loss will occur.

Figure 20:
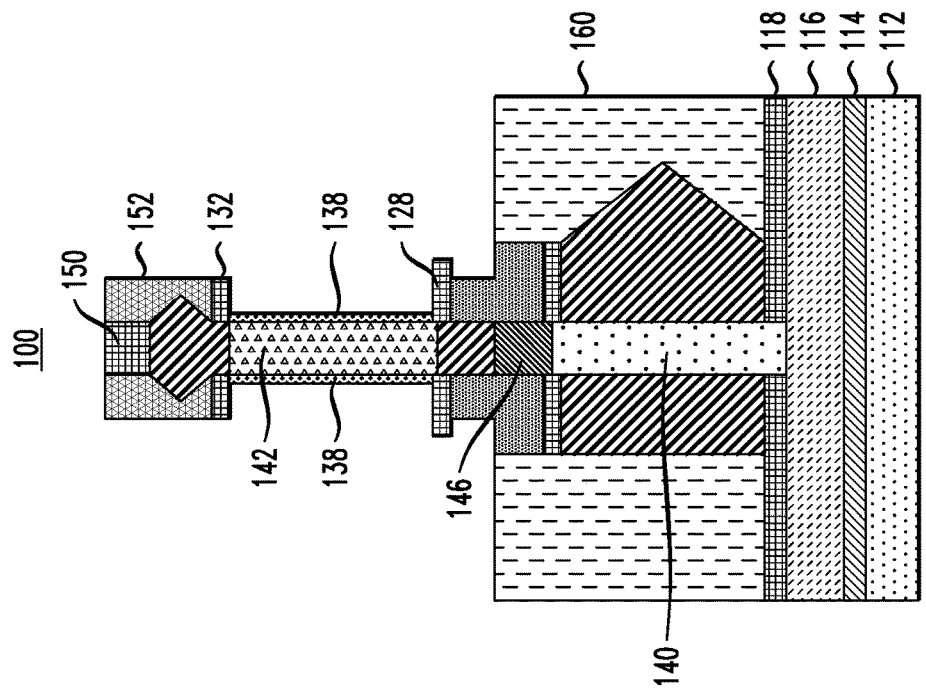
FIG. 20 is a schematic cross-sectional view illustrating manufacturing of a junction FET and showing removal of top sacrificial material, according to an embodiment of the invention.

FIG. 20 is a schematic cross-sectional view illustrating manufacturing of a junction FET and showing removal of top sacrificial material, according to an embodiment of the invention. Referring to FIG. 20, following the etching process described in connection with FIG. 19, the remainder of the sacrificial material 130 is removed, using, for example, an etching process that selectively removes the sacrificial material 130 (e.g., silicon) with respect to, for example, nitride, which can be the material of the spacer layers 152, 150, 132 and 128, and with respect to the first oxide layer 124.

Referring to FIG. 21, following the removal of sacrificial material 130, the oxide 138 on the channel sidewall is removed using, for example, a SiCoNi epitaxial pre-cleaning process performed prior to gate on channel epitaxy described in connection with FIG. 22. As noted herein above, a SiCoNi pre-clean can include a plasma-based cleaning chemistry to gently remove oxide at temperatures, for example, less than about 130° C.

FIG. 22 is a schematic cross-sectional view illustrating manufacturing of a junction FET and showing epitaxial formation of a second gate region, according to an embodiment of the invention. Referring to FIG. 22, an all-around gate 166 surrounding the channel region 142 on all sides is formed on the channel region 142. The gate region 166 can be formed by a gate on channel epitaxy process, where highly doped semiconductor material forming the gate is epitaxially grown onto the outer surface of the channel region 142. Referring to FIG. 22, given a channel surface having <110> oriented planes, a diamond shaped epitaxial gate structure will form, which is bound by <111> oriented planes. In other embodiments, dual- or tri-gate structures can be formed as an alternative to all-around gates.

The epitaxially grown gate region 166 can be in-situ doped during epitaxial growth processes, and dopants may include, for example, an n-type dopant selected from a group V element hydride including, but not limited to, arsine ($AsH_3$), and phosphine ($PH_3$), and a p-type dopant selected from a group III element hydride, including, but not limited to, diborane gas at various concentrations. For example, in a non-limiting example, a dopant concentration range may be e19/$cm^3$ to e20/$cm^3$, from 1e19/$cm^3$ to 4e20/$cm^3$ preferred. The gate region 166 can include, but is not necessarily limited to, silicon (Si), silicon germanium (SiGe), or other semiconductor material.

The upper channel region 142, as well as the layers 147 and 148, which function as respective bottom and top source/drain regions of the JFET including the channel 142, are doped with a second type doping, which may be either a p-type doping or an n-type doping. The gate region 166 is doped with a first type doping, which may be either an n-type doping or a p-type doping, opposite to the doping of the channel region 142, and the regions 147 and 148. According to an embodiment, the gate region 166 has an opposite doping type from the gate region 158, and the same doping type as channel region 140 and source/drain regions 116 and 146.

A pn junction between the gate 166 and the channel 142 is thereby formed. In one embodiment, as noted hereinabove, an n-channel JFET is formed when the channel 142, source 147 and drain 148 are n-type doped and the gate 166 is p-type doped. In another embodiment, a p-channel junction FET is formed when the channel, source and drain are p-type and the gate is n-type doped.

In addition, relative to each other in terms of concentration, in accordance with an embodiment of the present invention, the source/drain regions 147 and 148 can be the same or more heavily doped than the gate region 166, and the gate region 166 can be more heavily doped than the channel region 142. For example, a resulting structure can have heavily doped (e.g., n++) source/drain regions 147 and 148, a heavily doped (e.g., p++) gate region 166, and a low doped (e.g., n) channel region 142.

Figure 23:
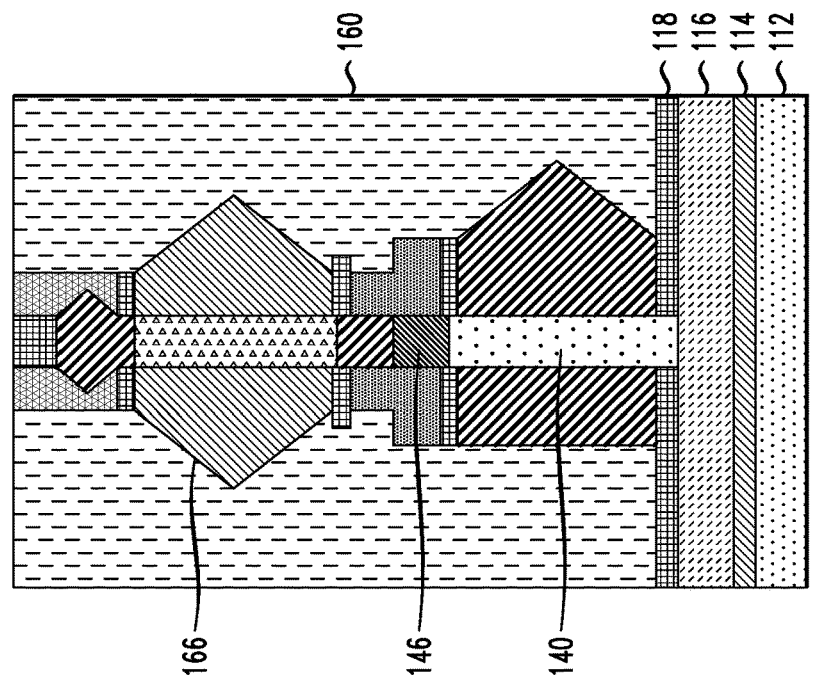
FIG. 23 is a schematic cross-sectional view illustrating manufacturing of a junction FET and showing formation of an inter-layer dielectric (ILD) layer, according to an embodiment of the invention.

FIG. 23 is a schematic cross-sectional view illustrating manufacturing of a junction FET and showing formation of an inter-layer dielectric (ILD) layer on the resulting structure from FIG. 22, according to an embodiment of the invention. Referring to FIG. 23, the space around the junction FET structure including gate region 166, on the existing ILD layer 160, is filled with an additional ILD layer (also designated by numeral 160). The additional ILD layer can be the same or similar material to that of the ILD layer 160 and can be deposited using the same or similar deposition techniques as those used for the ILD layer 160, followed by planarization by, for example, CMP, down to the nitride layer 150.

Figure 24:
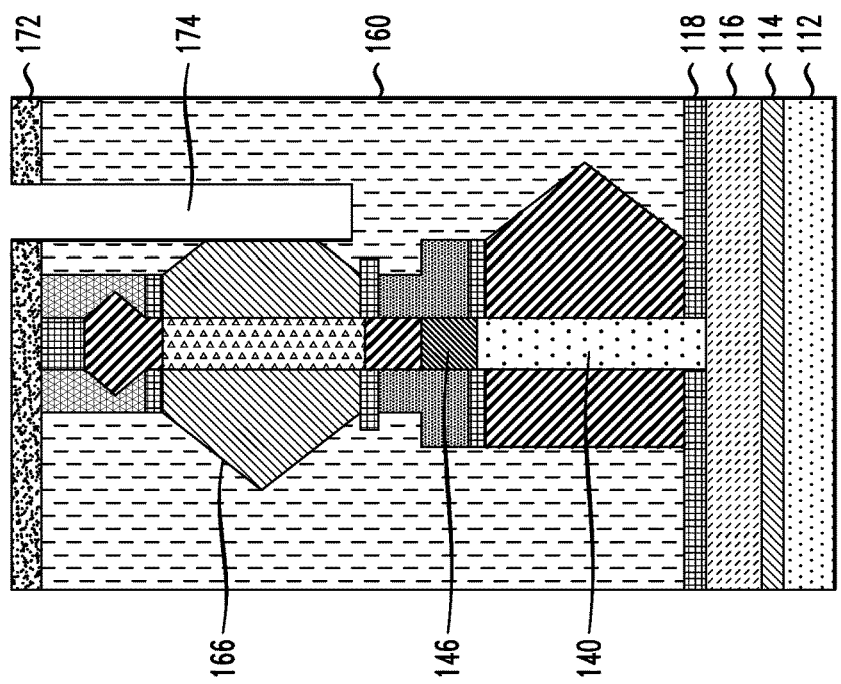
FIG. 24 is a schematic cross-sectional view illustrating manufacturing of a junction FET and showing formation of a contact trench, according to an embodiment of the invention.

FIG. 24 is a schematic cross-sectional view illustrating manufacturing of a junction FET and showing formation of a contact trench, according to an embodiment of the invention. A hard mask 172 comprising, for example, silicon nitride (SiN) covers portions of the ILD layer 160, and leaves exposed a portion of the ILD layer 160 corresponding to a right side of the gate region 166 to form a right contact trench 174, down to the gate region 166, stopping near (e.g., just above, level with or just below) spacer 128 using a timed etch process, such as, for example, RIE.

Figure 25:
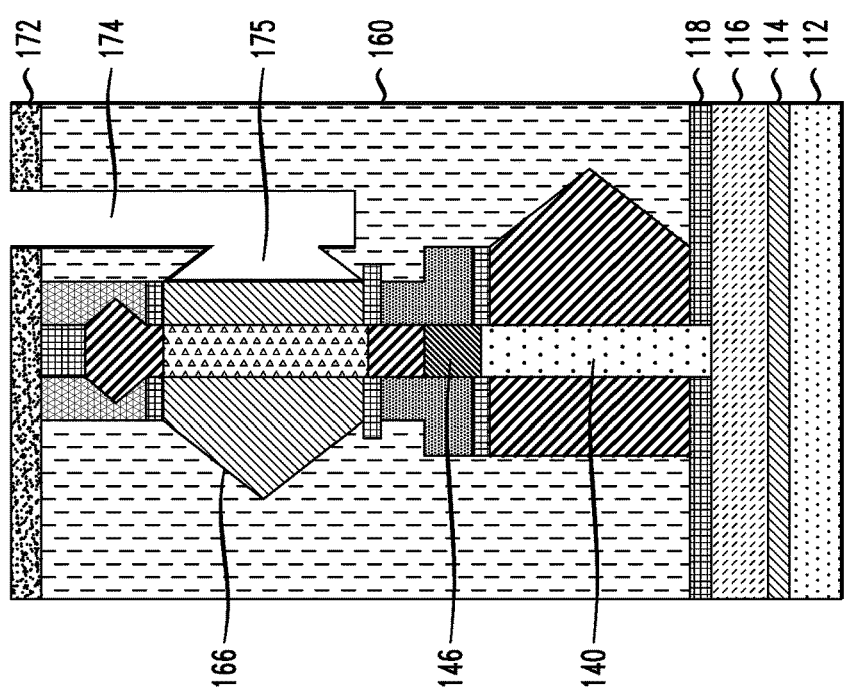
FIG. 25 is a schematic cross-sectional view illustrating manufacturing of a junction FET and showing removal of a portion the second gate region by exposure to an etchant through the contact trench, according to an embodiment of the invention.

FIG. 25 is a schematic cross-sectional view illustrating manufacturing of a junction FET and showing removal of a portion the second gate region 166 by exposure to an etchant through the contact trench 174, according to an embodiment of the invention. Referring to FIG. 25, a lateral etch of the gate region 166, for example, an HCl gas etch, is performed from the exposed side of the gate region 166 through the contact trench 174 to remove a portion of the gate region 166 to create a vacant area 175. As described further herein in connection with FIG. 27A, the portion of the gate region 166 is removed to prevent contact between the gate region 166 and a gate contact 181 to gate region 158.

Figure 26:
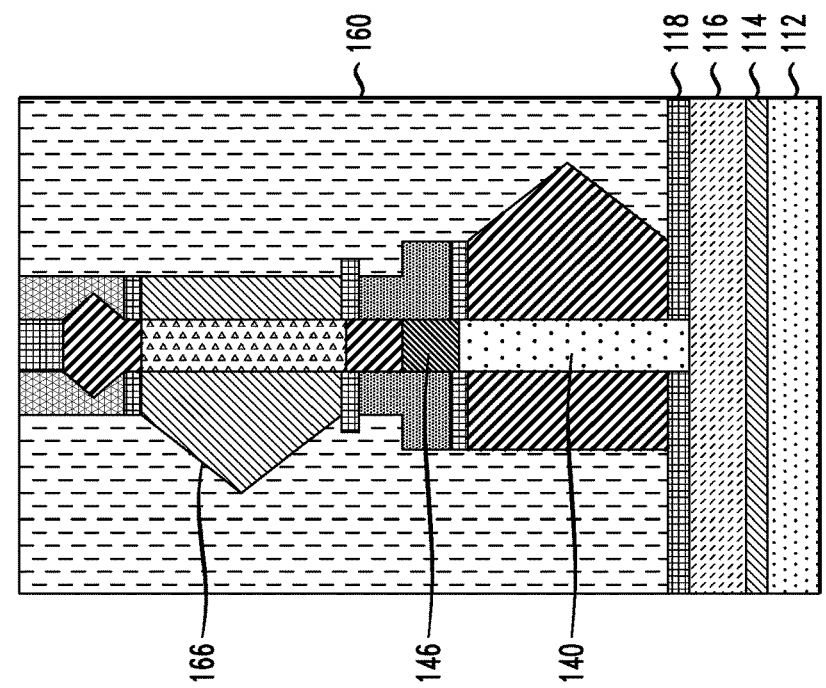
FIG. 26 is a schematic cross-sectional view illustrating manufacturing of a junction FET and showing filling the contact trench and the vacancy left by removal of the portion of the second gate region with an inter-layer dielectric (ILD) layer, according to an embodiment of the invention.

FIG. 26 is a schematic cross-sectional view illustrating manufacturing of a junction FET and showing filling the contact trench 174 and the vacancy 175 left by removal of the portion of the second gate region 166 with an inter-layer dielectric (ILD) layer, according to an embodiment of the invention. Referring to FIG. 26, ILD material is deposited to fill the contact trench 174 and the vacancy 175. The ILD material can be deposited using deposition techniques including, but not limited to, CVD, PECVD, RFCVD, PVD, ALD, MLD, MBD, PLD, LSMCD, and/or sputtering, followed by planarization by, for example, CMP. The ILD material can include the same or similar material to that of ILD layer 160. The mask 172 is removed, and the removal can be followed by a planarization. As can be seen in FIG. 26, as a result of the removal of a portion of the gate region 166, a shape of the second gate region 166 extending from the channel 142 differs between left and right sides of the channel 142.

Figure 27B:
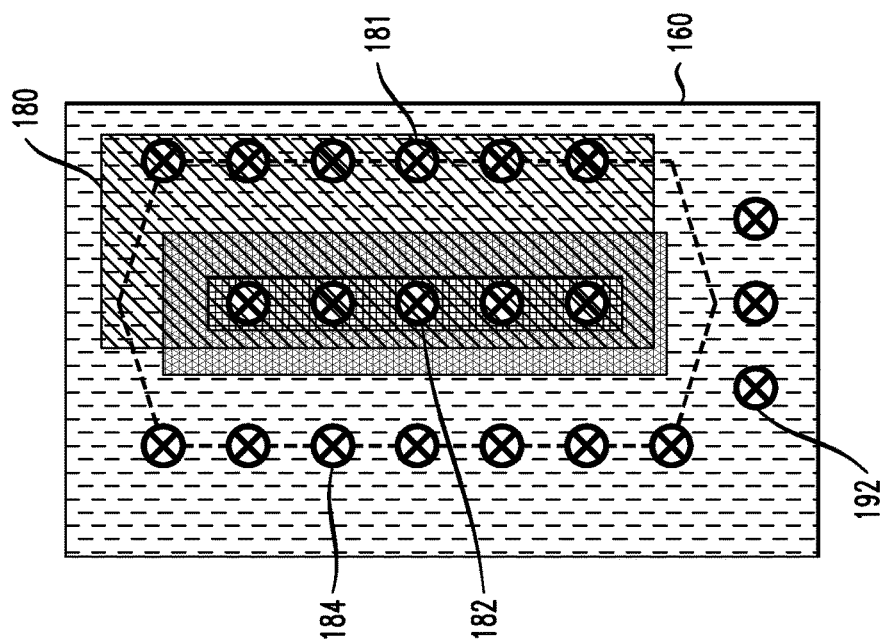
FIGS. 27A and 27B are schematic cross-sectional and top views, respectively, illustrating manufacturing of a junction FET and showing formation of contacts, according to an embodiment of the invention.
Figure 27A:
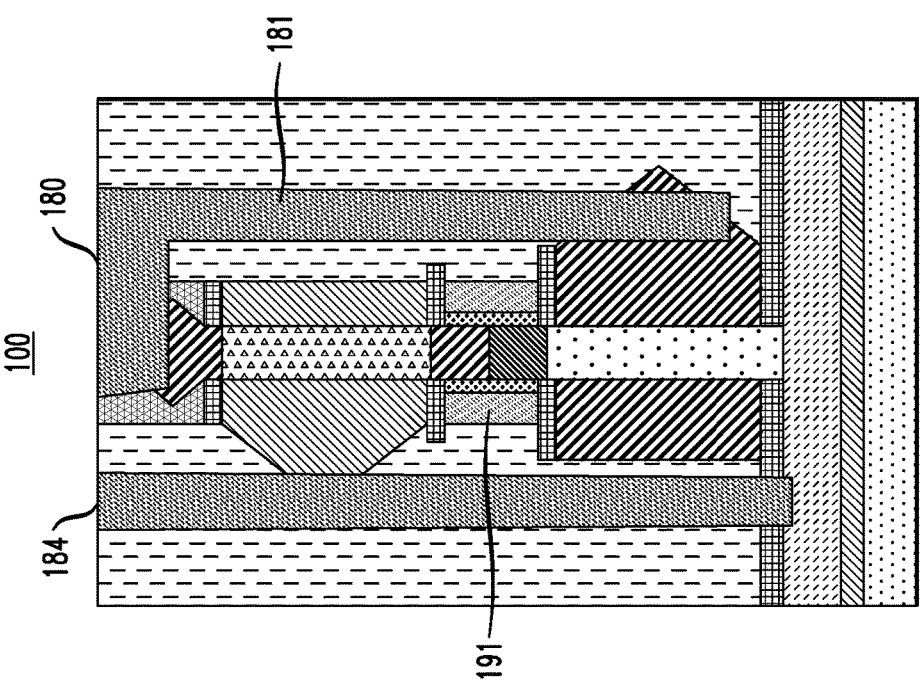

FIGS. 27A and 27B are schematic cross-sectional and top views, respectively, illustrating manufacturing of a junction FET and showing formation of contacts, according to an embodiment of the invention. For example, FIG. 27A and 27B show combination bottom source/drain and gate contacts 184 to bottom source/drain region 118 and gate region 166, and a merged contact region 180 including contacts 181 to gate region 158, and contacts 182 to top source/drain region 148. FIGS. 27A and 27B further illustrate a strapped silicide region 191 around doped regions 146 and 147. The contacts 181, 182 and 184 can be formed by etching trenches through the ILD layer 160, nitride layer 150 and/or bottom spacer layer 118 to reach the source/drain or gate regions, and then filling the trenches with a contact material, such as, for example, electrically conductive material including, but not necessarily limited to, tungsten, cobalt, zirconium, tantalum, titanium, aluminum, ruthenium, and/or copper. A silicide/germanide layer may be formed in the trenches by, for example, silicidation (e.g., formation of an alloy including a portion of a contact material with an underlying silicon or germanium layer), before filling the trenches with a remainder of electrically conductive material.

Figure 27C:
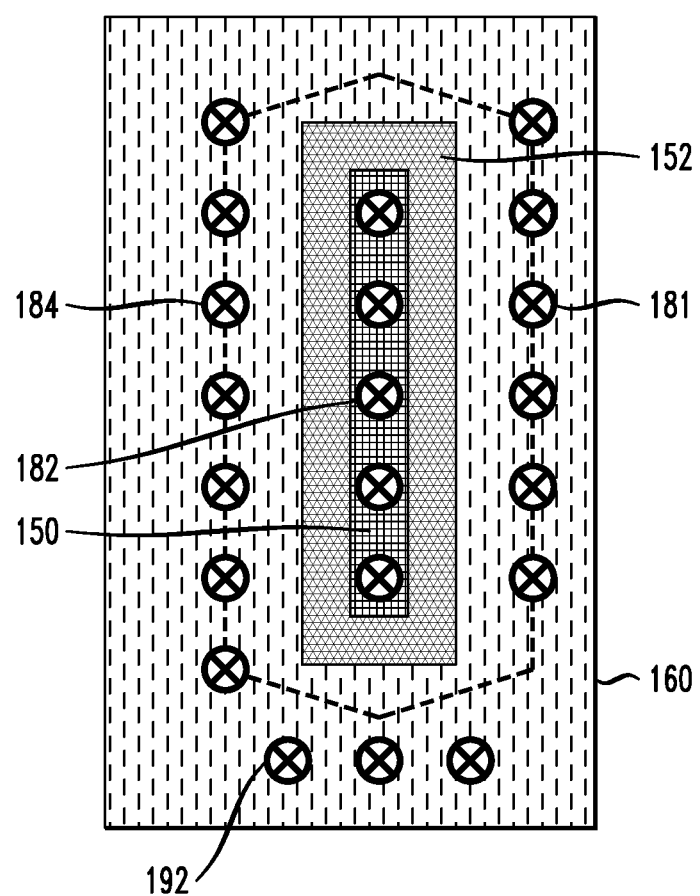
FIG. 27C is a schematic top view without the merged contact of FIGS. 27A and 27B, according to an embodiment of the invention.

The contacts 182 can be formed by removing portions of the nitride layer 150 to create trenches in the nitride layer 150 and filling the trenches with electrically conductive contact material to form contacts 182 contacting region 148. As noted above, a silicide/germanide layer may be formed in the trenches before filling the trenches with a remainder of electrically conductive material. FIG. 27C is a schematic top view without the merged contact of FIGS. 27A and 27B, in order to more clearly illustrate contacts 181 and 182, nitride layer 150 and spacer 152.

The contacts 181, 182 and 184 can be formed simultaneously, or in separate steps. In the case of all-around gate regions, a single gate contact may be sufficient since the gate region is continuous all-around a channel region.

Figure 28B:
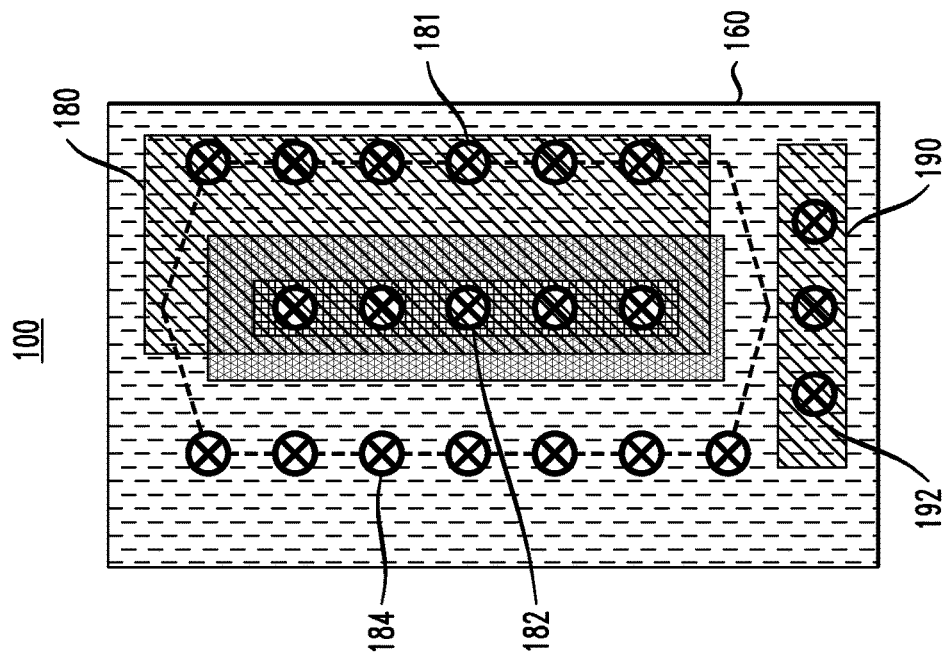
FIGS. 28A and 28B are schematic cross-sectional and top views, respectively, illustrating manufacturing of a junction FET and showing formation of a middle contact to a strapped silicide, according to an embodiment of the invention.
Figure 28A:
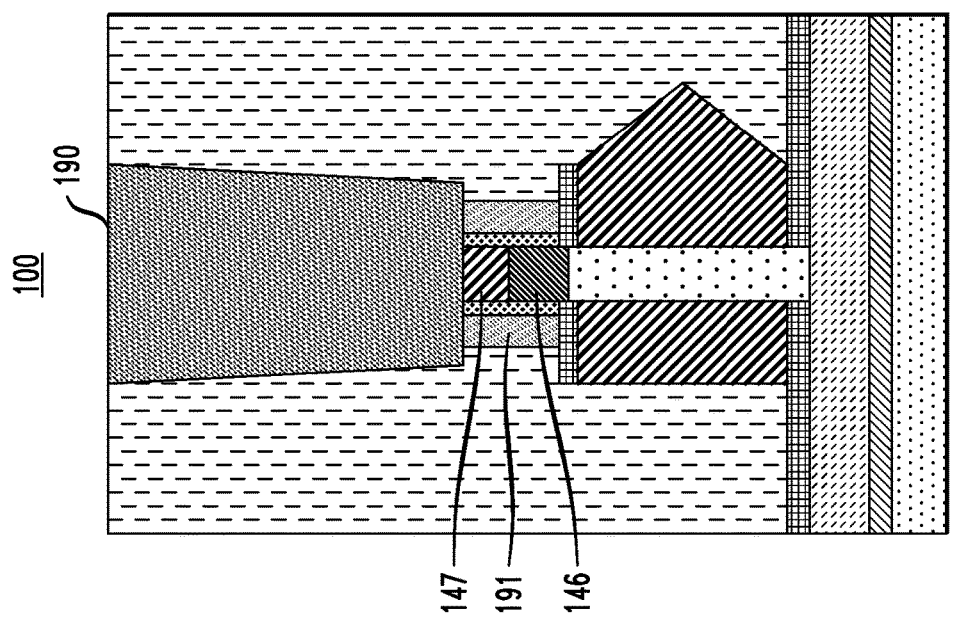

FIGS. 28A and 28B are schematic cross-sectional and top views, respectively, illustrating manufacturing of a junction FET and showing formation of a middle contact to a strapped silicide, according to an embodiment of the invention. FIG. 28A is a cross-sectional view taken along a plane different from that for FIG. 27A to illustrate a middle contact region 190 including contacts 192 to the strapped silicide 191. FIG. 28B is a top view similar to FIG. 27B, with the exception that FIG. 28B includes the middle contact region 190. The middle contact 190 can be formed by etching one or more trenches through the ILD layer 160 and through the upper device in the stack (e.g. the N-JFET including the N-JFET channel 142) to expose the strapped silicide region 191, and then filling the trenches with a contact material, such as, for example, electrically conductive material including, but not necessarily limited to, tungsten, cobalt, zirconium, tantalum, titanium, aluminum, ruthenium, and/or copper to form contacts 192. A silicide/germanide layer may be formed in the trenches by, for example, silicidation (e.g., formation of an alloy including a portion of a contact material with an underlying silicon or germanium layer), before filling the trenches with a remainder of electrically conductive material.

The strapped silicide region 191 comprises a silicide/contact which straps together oppositely doped source/drain regions (i.e., regions 146 and 147). The silicide/contact is formed on and around both regions 146 and 147 at the same time and provides a single contact to both oppositely doped source/drain regions.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A semiconductor device, comprising:
a substrate;
a first junction field effect transistor (JFET) on the substrate; and
a second JFET stacked on the first JFET;
wherein the second JFET is oppositely doped from the first JFET;
wherein the first JFET comprises:
a first source/drain region on the substrate;
a first channel region extending vertically with respect to the substrate from the first source/drain region;
a second source/drain region on the first channel region; and
a first gate region on at least one side of the first channel region;
wherein the second JFET comprises:
a third source/drain region on the second source/drain region;
a second channel region extending vertically with respect to the substrate from the third source/drain region;
a fourth source/drain region on the second channel region; and
a second gate region on at least one side of the second channel region.

2. The semiconductor device according to claim 1, wherein the first gate region surrounds the first channel region on all sides.

3. The semiconductor device according to claim 2, wherein a shape of the first gate region extending from the first channel region differs from a first side to a second side of the first channel region.

4. The semiconductor device according to claim 1, wherein the first gate region is oppositely doped from the first channel region.

5. The semiconductor device according to claim 1, further comprising a strapped contact region formed around the second and third source/drain regions.

6. The semiconductor device according to claim 1, wherein a shape of the second gate region extending from the second channel region differs from a first side to a second side of the second channel region.

7. The semiconductor device according to claim 1, wherein the second gate region is oppositely doped from the second channel region.

8. The semiconductor device according to claim 1, wherein the second gate region is oppositely doped from the first gate region.

9. The semiconductor device according to claim 1, wherein the third source/drain region is oppositely doped from the second source/drain region.

10. The semiconductor device according to claim 1, wherein the second channel region is oppositely doped from the first channel region.

* * * * *